United States Patent
Kim

(10) Patent No.: US 8,115,541 B2
(45) Date of Patent: Feb. 14, 2012

(54) THREE-LEVEL HALF-BRIDGE PULSE-WIDTH MODULATION AMPLIFIER AND METHOD OF DRIVING THE SAME

(75) Inventor: Bong Joo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/660,537

(22) Filed: Mar. 1, 2010

(65) Prior Publication Data

US 2010/0225391 A1 Sep. 9, 2010

(30) Foreign Application Priority Data

Mar. 3, 2009 (KR) .................. 10-2009-0018097

(51) Int. Cl.
*H03F 3/38* (2006.01)
(52) U.S. Cl. .......................... 330/10; 330/251
(58) Field of Classification Search .............. 330/10, 330/251, 207 A
See application file for complete search history.

(56) References Cited

U.S. PATENT DOCUMENTS

| 6,724,249 | B1 | 4/2004 | Nilsson |
| 7,336,794 | B2 * | 2/2008 | Furst et al. .................. 381/117 |
| 7,733,171 | B2 * | 6/2010 | Guilherme et al. ............ 330/10 |
| 7,956,681 | B2 * | 6/2011 | Guilherme et al. ............ 330/10 |
| 2003/0123681 | A1 | 7/2003 | Furst et al. |

FOREIGN PATENT DOCUMENTS

| JP | 2008-48305 A | 2/2008 |
| KR | 10-2004-0041065 A | 5/2004 |
| KR | 10-2004-0063980 A | 7/2004 |

* cited by examiner

*Primary Examiner* — Henry Choe
(74) *Attorney, Agent, or Firm* — Onello & Mello, LLP

(57) ABSTRACT

A three-level half-bridge PWM amplifier includes a PWM generator and an output stage. The PWM generator changes a width of a pulse at a first level or a second level according to amplitude of an input signal and outputs a three-level PWM output signal having the first level, the second level, and a reference level. The output stage drives an output node connected to a terminal of a load to a first power supply voltage, a second power supply voltage, or a third power supply voltage based on the three-level PWM output signal. Accordingly, unnecessary static current consumption is reduced, thereby increasing efficiency.

20 Claims, 14 Drawing Sheets

PWM Output (Positive Peak Input)

PWM Output (Zero Input)

PWM Output (Negative Peak Input)

| PWM_Out | VDD_EN | VSS_EN | GND_EN |
|---------|--------|--------|--------|
| VDD     | 0      | 0      | 0      |
| VSS     | 1      | 1      | 0      |
| GND     | 1      | 0      | 1      |

(1) 3-Level PWM Output (Increasing from Zero to Positive Peak)

(2) 3-Level PWM Output (Positive Peak)

(3) 3-Level PWM Output (Decreasing from Positive Peak to Zero)

(4) 3-Level PWM Output (Zero)

(5) 3-Level PWM Output (Decreasing from Zero to Negative Peak)

(6) 3-Level PWM Output (Negative Peak)

(7) 3-Level PWM Output (Increasing from Negative Peak to Zero)

(8) 3-Level PWM Output (Zero)

THREE-LEVEL HALF-BRIDGE PULSE-WIDTH MODULATION AMPLIFIER AND METHOD OF DRIVING THE SAME

CROSS-REFERENCE TO RELATED APPLICATIONS

This application claims priority under 35 U.S.C. §119(e) to Korean patent application No. 10-2009-0018097 filed on Mar. 3, 2009 in the Korean Intellectual Property Office, the contents of which are incorporated herein by reference in their entirety.

BACKGROUND

1. Field

The present inventive concept relates to an amplifier, and more particularly, to a half-bridge pulse-width modulation (PWM) amplifier.

2. Description of the Related Art

PWM is a technique of changing a pulse width according to an amplitude of an input signal. PWM has advantages of high efficiency, high resolution, and low power consumption. Thus, PWM is used for amplifiers, for example, class-D amplifiers, and audio systems. Accordingly, a PWM amplifier is called a class-D amplifier. An audio system using PWM usually embeds an audio signal in a PWM signal having a higher frequency compared to a sample rate of the audio signal, when transmitting the audio signal. A PWM amplifier converts an audio signal into a digital PWM signal, amplifies the PWM signal, and outputs it to a speaker or a headphone, for example, a headset or an earphone.

To drive speakers, a full-bridge PWM amplifier is conventionally used. To drive devices like headphones to which an input signal is applied on the basis of zero voltage or a ground level, a half-bridge PWM amplifier is conventionally used. Since a PWM signal is conventionally a two-level signal, a predetermined positive (+) voltage and the ground level or a positive voltage and a negative voltage are switched according to the PWM signal in a two-level PWM driving method.

In the two-level PWM driving method, even when an input signal is "0", an output terminal still maintains a PWM duty of 50:50 and performs switching. As a result, in addition to dynamic current consumed by an audio signal, static current is always consumed unnecessarily, thereby decreasing output efficiency.

SUMMARY

Exemplary embodiments of the present inventive concept provide a three-level half-bridge pulse-width modulation (PWM) amplifier for increasing efficiency by reducing static current consumption and a method of driving the same.

According to one aspect of an exemplary embodiment of the present inventive concept, there is provided a three-level half-bridge PWM amplifier including a PWM generator and an output stage. The PWM generator is configured to change a width of a pulse at a first level or a second level according to amplitude of an input signal and outputs a three-level PWM output signal having the first level, the second level, and a reference level. The output stage is configured to drive an output node connected to a terminal of a load to a first power supply voltage, a second power supply voltage, or a third power supply voltage based on the three-level PWM output signal.

In one exemplary embodiment, the PWM generator may output the three-level PWM output signal by summing a first PWM signal obtained by changing the width of the pulse at the first level according to an amplitude of a first input signal of the input signal greater than the reference level of the input signal and a second PWM signal obtained by changing the width of the pulse at the second level according to an amplitude of a second input signal of the input signal smaller than the reference level of the input signal.

In one exemplary embodiment, the reference level may be a ground level, the first input signal may be a positive input signal, and the second input signal may be a negative input signal. In another exemplary embodiment, the PWM generator may include a first comparator configured to compare the positive input signal with a first sawtooth wave signal swinging between the first level and the reference level and to generate the first PWM signal and a second comparator configured to compare the negative input signal with a second sawtooth wave signal swinging between the reference level and the second level and to generate the second PWM signal. The second sawtooth wave signal may be a signal level-downed by a swing width of the first sawtooth wave signal and has the same waveform as the first sawtooth wave signal. In another embodiment, the third power supply voltage has the ground level, the first power supply voltage has a positive voltage higher than the third power supply voltage, and the second power supply voltage has a negative voltage lower than the third power supply voltage.

In one exemplary embodiment, the output stage may include a pull-up unit configured to drive the output node to the first power supply voltage in response to a first enable signal, a pull-down unit configured to drive the output node to the second power supply voltage in response to a second enable signal, and a switching unit configured to drive the output node to the third power supply voltage in response to a third enable signal. In another exemplary embodiment, the pull-up unit comprises a pull-up transistor connected between the output node and the first power supply voltage and turned on in response to the first enable signal, the pull-down unit comprises a pull-down transistor connected between the output node and the second power supply voltage and turned on in response to the second enable signal, and the switching unit comprises at least one switch connected between the output node and the third power supply voltage and turned on in response to the third enable signal.

According to another aspect of an exemplary embodiment of the present inventive concept, an audio system includes a three-level half bridge PWM amplifier. The three-level half bridge PWM amplifier includes a PWM generator and an output stage. The PWM generator is configured to change a width of a pulse at a first level or a second level according to amplitude of an input signal and outputs a three-level PWM output signal having the first level, the second level, and a reference level. The output stage is configured to drive an output node connected to a terminal of a load to a first power supply voltage, a second power supply voltage, or a third power supply voltage based on the three-level PWM output signal.

In one embodiment, the PWM generator may output the three-level PWM output signal by summing a first PWM signal obtained by changing the width of the pulse at the first level according to an amplitude of a first input signal of the input signal greater than the reference level of the input signal and a second PWM signal obtained by changing the width of the pulse at the second level according to an amplitude of a second input signal of the input signal smaller than the reference level of the input signal.

In one embodiment, the reference level may be a ground level, the first input signal may be a positive input signal, and the second input signal may be a negative input signal. In another exemplary embodiment, the PWM generator may include a first comparator configured to compare the positive input signal with a first sawtooth wave signal swinging between the first level and the reference level and to generate the first PWM signal and a second comparator configured to compare the negative input signal with a second sawtooth wave signal swinging between the reference level and the second level and to generate the second PWM signal. The second sawtooth wave signal may be a signal level-downed by a swing width of the first sawtooth wave signal and has the same waveform as the first sawtooth wave signal. In another embodiment, the third power supply voltage has the ground level, the first power supply voltage has a positive voltage higher than the third power supply voltage, and the second power supply voltage has a negative voltage lower than the third power supply voltage.

In one embodiment, the output stage may include a pull-up unit configured to drive the output node to the first power supply voltage in response to a first enable signal, a pull-down unit configured to drive the output node to the second power supply voltage in response to a second enable signal, and a switching unit configured to drive the output node to the third power supply voltage in response to a third enable signal. In another exemplary embodiment, the pull-up unit comprises a pull-up transistor connected between the output node and the first power supply voltage and turned on in response to the first enable signal, the pull-down unit comprises a pull-down transistor connected between the output node and the second power supply voltage and turned on in response to the second enable signal, and the switching unit comprises at least one switch connected between the output node and the third power supply voltage and turned on in response to the third enable signal.

According to another exemplary embodiment of the present inventive concept, there is provided a method of driving a three-level half-bridge PWM amplifier. The method includes generating a three-level PWM output signal having a first level, a second level, and a reference level and having a width of a pulse changing at the first level or the second level according to an amplitude of an input signal, and driving an output node connected to a terminal of a load to one voltage among a first power supply voltage, a second power supply voltage, or a third power supply voltage based on the three-level PWM output signal.

In one embodiment, the generating the three-level PWM output signal includes generating a first PWM signal by changing the width of the pulse at the first level according to an amplitude of a first input signal of the input signal greater than the reference level of the input signal, generating a second PWM signal by changing the width of the pulse at the second level according to an amplitude of a second input signal of the input signal smaller than the reference level of the input signal, and outputting the three-level PWM output signal by summing the first PWM signal and the second PWM signal. In another embodiment, the reference level is a ground level, the first input signal is a positive input signal, and the second input signal is a negative input signal. The generating the first PWM signal includes comparing the positive input signal with a first sawtooth wave signal swinging between the first level and the reference level, and the generating the second PWM signal comprises comparing the negative input signal with a second sawtooth wave signal swinging between the reference level and the second level. The second sawtooth wave signal is a signal level-downed by a swing width of the first sawtooth wave signal and has the same waveform as the first sawtooth wave signal.

In another embodiment, while the first input signal is being input, the width of the pulse at the first level is changed according to the amplitude of the first input signal and the pulse at the second level has a predetermined minimum width. While the second input signal is being input, the width of the pulse at the second level is changed according to the amplitude of the second input signal and the pulse at the first level has the predetermined minimum width. In another embodiment, the three-level PWM output signal is at the reference level, except for the pulse having the minimum width at the first level and the pulse having the minimum width at the second level, when the input signal is at the reference level.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity. In the drawings.

DETAILED DESCRIPTION OF THE EMBODIMENTS

Figure 1:
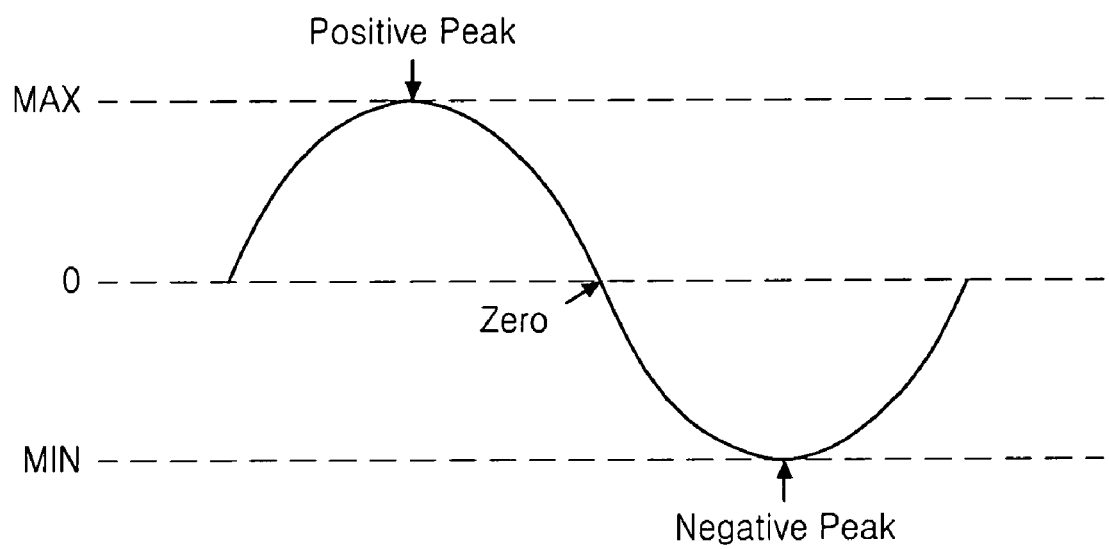
FIG. 1 is a waveform diagram of an exemplary amplifier input signal.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a waveform diagram of an exemplary amplifier input signal. FIG. 2 is a diagram of a conventional two-level pulse-width modulation (PWM) signal generated with respect to the amplifier input signal illustrated in FIG. 1.

Figure 2A:
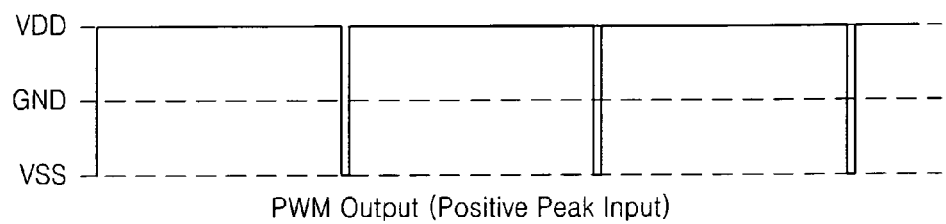
FIGS. 2A-2C are diagrams of a conventional two-level pulse-width modulation (PWM) signal generated with respect to the amplifier input signal illustrated in FIG. 1.
Figure 2B:
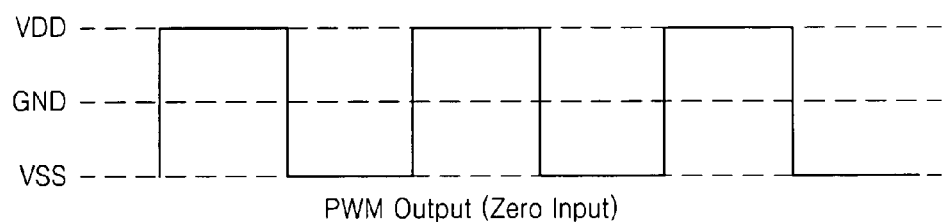
Figure 2C:
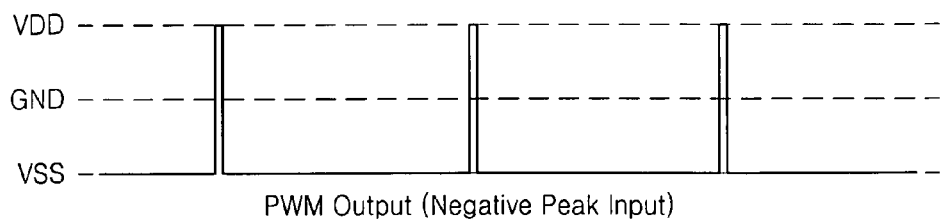

Referring to FIG. 1, it is assumed that the amplifier input signal swings between a positive peak voltage MAX and a negative peak voltage MIN. A PWM output signal is conventionally a pulse signal having two levels VDD and VSS. Referring to FIGS. 2A-2C, the PWM output signal has the longest "high" period, namely, the period during which the PWM output signal is at the level VDD, when the amplifier input signal has a positive peak voltage MAX, as illustrated in FIG. 2A, and has the longest "low" period, namely, the period during which the PWM output signal is at the level VSS, when the amplifier input signal has a negative peak voltage MIN, as illustrated in FIG. 2C. That is, when the amplifier input signal increases to the level of the positive peak voltage MAX, the PWM output signal increasingly has the "high" period during which the PWM output signal is at the level VDD. When the amplifier input signal decrease to the level of the negative peak voltage MIN, the PWM output signal increasingly has the "low" period during which the PWM output signal is at the level VSS. When the amplifier input signal has a zero voltage, the PWM output signal has the "high" period equal to the "low" period and thus has a duty ratio of 50:50, as illustrated in FIG. 2B.

Although PWM amplifiers, for example, class-D amplifiers, have higher efficiency than class-A, class-B and class-AB amplifiers, PWM amplifiers continuously consume static current unnecessarily while switching between the level VDD and the level VSS (or the ground level). To increase the efficiency of PWM amplifiers, it is necessary to reduce such static current consumption.

Figure 3:
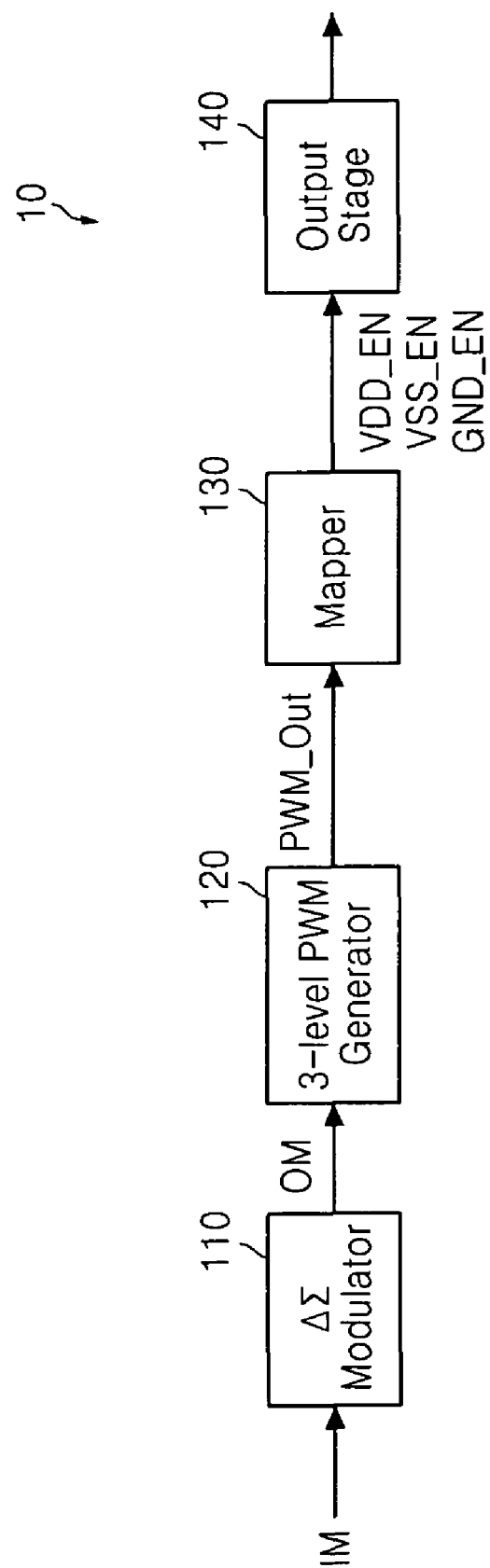
FIG. 3 is a schematic block diagram of a half-bridge PWM amplifier, according to an exemplary embodiment of the present inventive concept.

FIG. 3 is a schematic block diagram of a half-bridge PWM amplifier 10 according to an exemplary embodiment of the present inventive concept. Referring to FIG. 3, the half-bridge PWM amplifier 10 includes a delta-sigma modulator 110, a three-level PWM generator 120, a mapper 130, and an output stage 140.

The delta-sigma modulator 110 quantizes input signal IM into a smaller number of bits that are pulse-code modulation (PCM) data. Delta-sigma modulation is a modulation scheme combined with oversampling to reduce quantization noise of PCM data and provide high resolution with a small number of bits. When the half-bridge PWM amplifier 10 is an audio amplifier of an audio system, for instance, an oversampled audio input signal has resolution too high to be directly converted into a PWM signal. In this case, it is necessary to decrease the resolution of the audio input signal to an appropriate level for the conversion to a PWM signal using the delta-sigma modulator 110.

Figure 4:
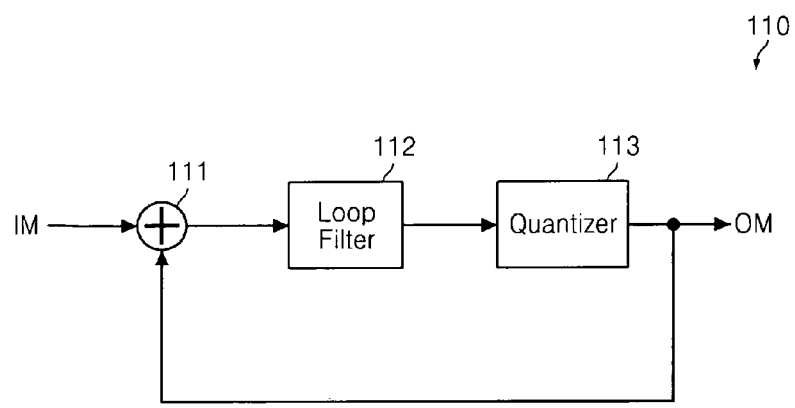
FIG. 4 is a schematic block diagram of a delta-sigma modulator illustrated in FIG. 3, according to an exemplary embodiment of the present inventive concept.

FIG. 4 is a schematic block diagram of the delta-sigma modulator 110 illustrated in FIG. 3, according to an exemplary embodiment of the present inventive concept. Referring to FIG. 4, the delta-sigma modulator 110 includes an adder 111, a loop filter 112, and an M-bit quantizer 113. Accordingly, an output signal OM of the delta-sigma modulator 110 is an M-bit quantized signal. In this exemplary embodiment, M is much less than the number of bits of PCM data, namely, the input signal IM. For instance, when the PCM data is sixteen or twenty bits in length, the output signal OM of the delta-sigma modulator 110 may be four or five bits in length.

Figure 5:
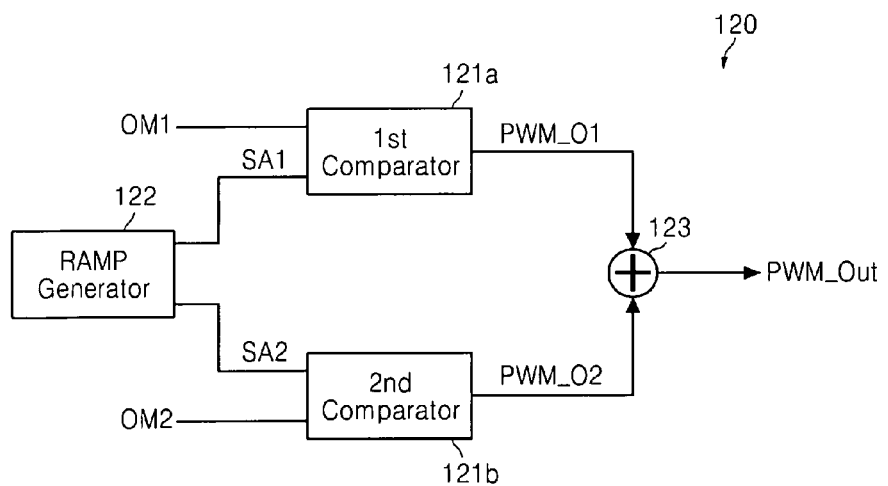
FIG. 5 is a schematic block diagram of a three-level PWM generator illustrated in FIG. 3, according to an exemplary embodiment of the present inventive concept.

FIG. 5 is a schematic block diagram of the three-level PWM generator 120 illustrated in FIG. 3, according to an exemplary embodiment of the present inventive concept. Referring to FIG. 5, the three-level PWM generator 120 changes the width of a pulse according to an amplitude (or level) of the output signal OM input thereto, thereby generating a PWM output signal PWM_Out. The three-level PWM generator 120 may be an analog PWM generator. The three-level PWM generator 120 includes a ramp generator 122, a first comparator 121a, a second comparator 121b, and an adder 123.

Figure 7:
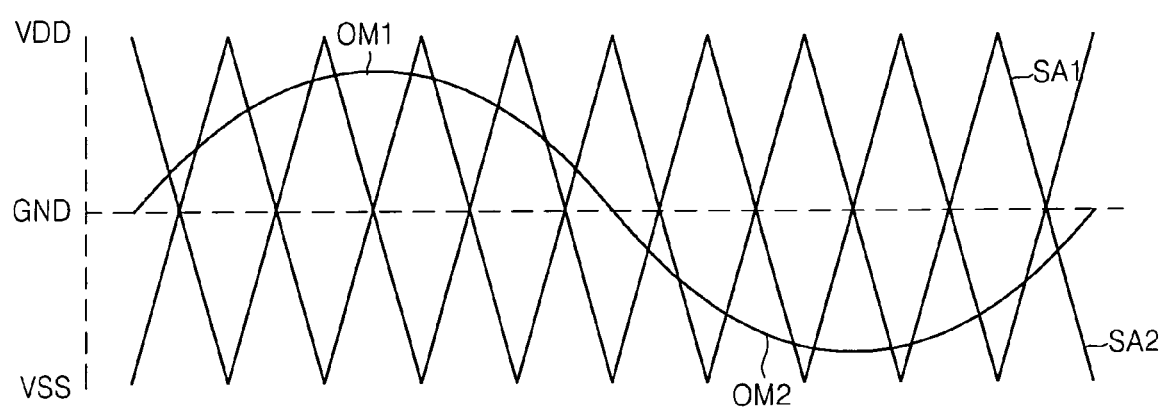
FIG. 7 and FIGS. 8A and 8B are waveform diagrams illustrating the operation of a PWM amplifier, according to an exemplary embodiment of the present inventive concept.

The ramp generator 122 generates a first sawtooth wave signal SA1 and a second sawtooth wave signal SA2. As illustrated in FIG. 7, the first sawtooth wave signal SA1 may periodically increase and decrease between a first level, for example, a predetermined positive voltage, and a reference level, for example, the ground level, and the second sawtooth wave signal SA2 may have the same waveform as the first sawtooth wave signal SA1 but periodically increase and decrease between the reference level and a second level, for example, a predetermined negative voltage. The first sawtooth wave signal SA1 swings between the first level and the reference level and the second sawtooth wave signal SA2 swings between the reference level and the second level. The second sawtooth wave signal SA2 may be a signal level-downed by a swing width of the first sawtooth wave signal SA1 and may have the same waveform as the first sawtooth wave signal SA1. In the embodiments of the present inventive concept, the first level is the level VDD, the reference level is the ground level, and the second level is the level VSS; however, the present inventive concept is not restricted to these embodiments.

The first comparator 121a compares the first sawtooth wave signal SA1 with a first input signal OM1 and outputs a first PWM signal PWM_01. The second comparator 121b compares the second sawtooth wave signal SA2 with a second input signal OM2 and outputs a second PWM signal PWM_02. The adder 123 sums the first PWM signal PWM_01 from the first comparator 121a and the second PWM signal PWM_02 from the second comparator 121b and outputs the PWM output signal PWM_Out.

The first input signal OM1 may be a signal having a level higher than or equal to the reference level, that is, the ground level of "0," in the output signal OM of the delta-sigma modulator 110, and the second input signal OM2 may be a signal having a level lower than or equal to "0" in the output signal OM of the delta-sigma modulator 110. The first comparator 121a outputs the first PWM signal PWM_01 at the first level, that is, the level VDD, when the first input signal OM1 is greater than the first sawtooth wave signal SA1 and outputs the first PWM signal PWM_01 at the reference level, that is, the ground level, when the first input signal OM1 is smaller than the first sawtooth wave signal SA1. The second comparator 121b outputs the second PWM signal PWM_02 at the reference level, that is, the ground level, when the second input signal OM2 is greater than the second sawtooth wave signal SA2 and outputs the second PWM signal PWM_02 at the second level, that is, the level VSS, when the second input signal OM2 is smaller than the second sawtooth wave signal SA2.

Accordingly, the three-level PWM generator 120 outputs the PWM output signal PWM_Out having three levels, namely, the first level, the second level, and the reference level. Alternatively, the three-level PWM generator 120 may generate the PWM output signal PWM_Out by counting digital clocks according to the level of the signal OM input thereto.

Figure 6:
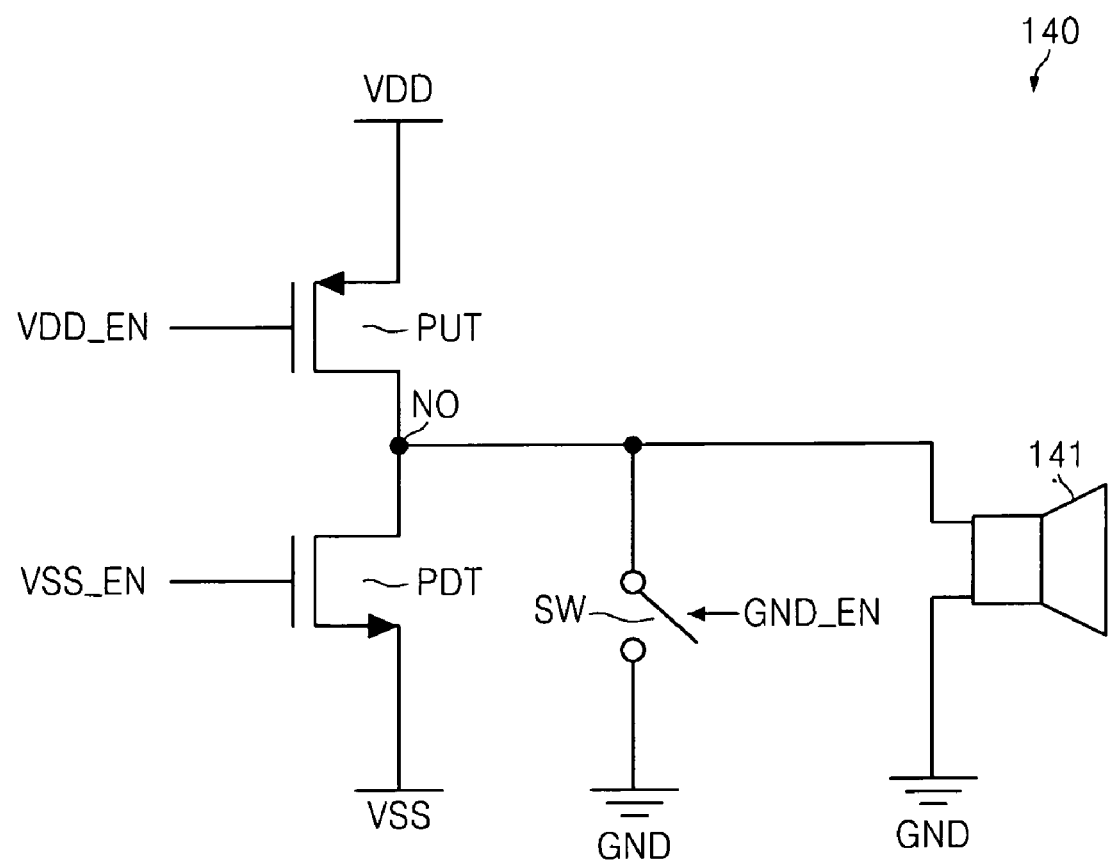
FIG. 6 is a circuit diagram of an output stage illustrated in FIG. 3, according to an exemplary embodiment of the present inventive concept.

FIG. 6 is a circuit diagram of the output stage 140 illustrated in FIG. 3, according to an exemplary embodiment of the present inventive concept. The output stage 140 drives an output node NO to a first power supply voltage VDD, a second power supply voltage VSS, or a third power supply voltage GND based on the three-level PWM output signal PWM_Out. Referring to FIG. 6, the output stage 140 includes a pull-up transistor PUT, a pull-down transistor PDT, and a switching unit SW.

The pull-up transistor PUT is connected between the first power supply voltage VDD and the output node NO and drives the output node NO to the first power supply voltage VDD in response to a first enable signal VDD_EN. The half-bridge PWM amplifier of FIG. 3 may be used in an audio system. FIG. 6 illustrates the output stage 140 in an audio system. The output node NO is connected to a terminal of a load 141, for example, a headphone, an earphone, or a headset, of the audio system. Another terminal of the load 141 is connected to the ground. The pull-down transistor PDT is connected between the output node NO and the second power supply voltage VSS and drives the output node NO to the second power supply voltage VSS in response to a second enable signal VSS_EN.

The switching unit SW is connected between the output node NO and the third power supply voltage GND and is turned on or off in response to a third enable signal GND_EN. When the switching unit SW is turned on, the output node NO is connected to the third power supply voltage GND, that is, the ground, and a voltage at the output node NO becomes the ground level. The switching unit SW may include at least one switch, which may be implemented, for example, by a transistor or a transmission gate.

Referring back to FIG. 3, the mapper 130 generates the first through third enable signals VDD_EN, VSS_EN, and GND_EN according to the PWM output signal PWM_Out, which will be described in detail hereinafter.

Figure 8A:
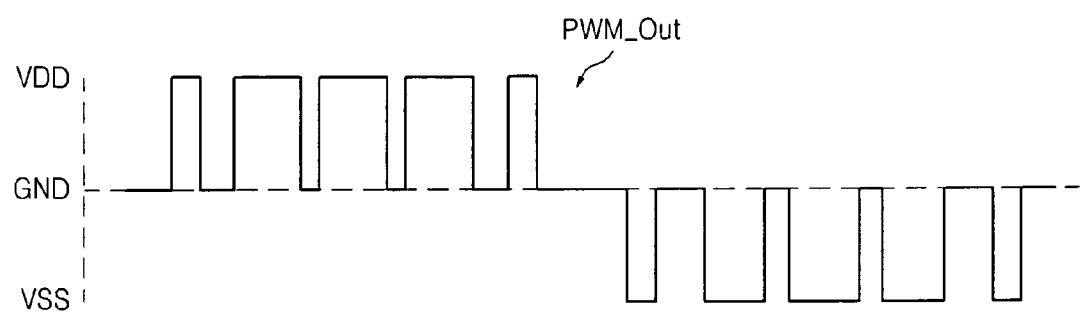
Figure 8B:
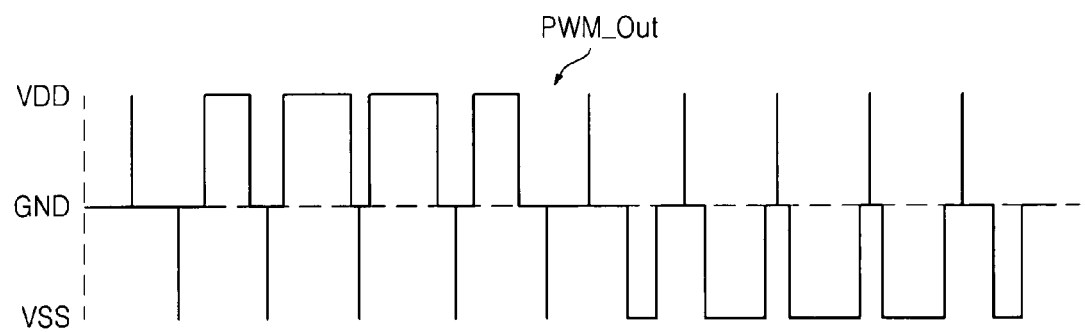

FIG. 7 and FIGS. 8A and 8B are waveform diagrams for explaining the operation of the half-bridge PWM amplifier 10, according to an exemplary embodiment of the present inventive concept. FIG. 7 is a waveform diagram of the signals OM1, OM2, SA1, and SA2 input to the three-level PWM generator 120. FIGS. 8A and 8B are waveform diagrams of the PWM output signal PWM_Out.

The operation of the half-bridge PWM amplifier 10 will be described with reference to FIGS. 3 through 8B.

During a period in which a positive input signal, namely, the first input signal OM1, greater than zero of an input signal, namely output signal OM, is being input, the first comparator 121a compares the first sawtooth wave signal SA1 with the first input signal OM1, outputs the first power supply voltage VDD when the first input signal OM1 is greater than the first sawtooth wave signal SA1, and outputs the third power supply voltage GND when the first input signal OM1 is smaller than the first sawtooth wave signal SA1, as illustrated in FIGS. 8A and 8B. During this period, as illustrated in FIG. 8B, the second comparator 121b outputs a minimum pulse signal having a predetermined minimum width and having the second power supply voltage VSS at each cycle of the second sawtooth wave signal SA2, for example, each time the second sawtooth wave signal SA2 is zero.

The width of a pulse of the PWM output signal PWM_Out may change from a predetermined minimum value to a predetermined maximum value. A minimum pulse is a pulse that has the minimum width among pulses of the PWM output signal PWM_Out and may be referred to a return-zero pulse.

During a period in which a negative input signal, namely, the second input signal OM2, smaller than zero of the input signal is being input, the second comparator 121b compares the second sawtooth wave signal SA2 with the second input signal OM2, outputs the third power supply voltage GND when the second input signal OM2 is greater than the second sawtooth wave signal SA2, and outputs the second power supply voltage VSS when the second input signal OM2 is smaller than the second sawtooth wave signal SA2, as illustrated in FIGS. 8A and 8B. During this period, as illustrated in FIG. 8B, the first comparator 121a outputs a minimum pulse signal having a predetermined minimum width and having the first power supply voltage VDD at each cycle of the first sawtooth wave signal SA1, for example, each time when the first sawtooth wave signal SA1 is zero.

Accordingly, the PWM output signal PWM_Out resulting from summing the first PWM signal PWM_01 output from the first comparator 121a and the second PWM signal PWM_02 output from the second comparator 121b may be a three-level pulse signal having the first power supply voltage VDD, the second power supply voltage VSS, and the third power supply voltage GND, as illustrated in FIG. 8A. If the first comparator 121a and the second comparator 121b output minimum pulses, that is, return-zero pulses, the PWM output signal PWM_Out may include pulses, as illustrated in FIG. 8B.

As a matter of convenience, the input signals OM1 and OM2 are illustrated as analog sine-wave signals in FIG. 7; however, signals compared with the sawtooth wave signals SA1 and SA2 may be delta-sigma modulated signals and, thus, have different waveforms than the input signals OM1 and OM2 illustrated in FIG. 7.

In addition, for clarity of the description, the first comparator 121a and the second comparator 121b are separately provided in the embodiments illustrated in FIG. 5; however, the present inventive concept is not restricted to these embodiments. For instance, the first comparator 121a and the second comparator 121b may be combined into one comparator which compares a positive input signal, namely, the first input signal OM1, greater than zero with the first sawtooth wave signal SA1 and outputs the PWM output signal PWM_Out during a period in which the positive input signal is received and compares a negative input signal, namely, the second input signal OM2, smaller than zero with the second sawtooth wave signal SA2 and outputs the PWM output signal PWM_Out during a period in which the negative input signal is received.

Figure 9A:
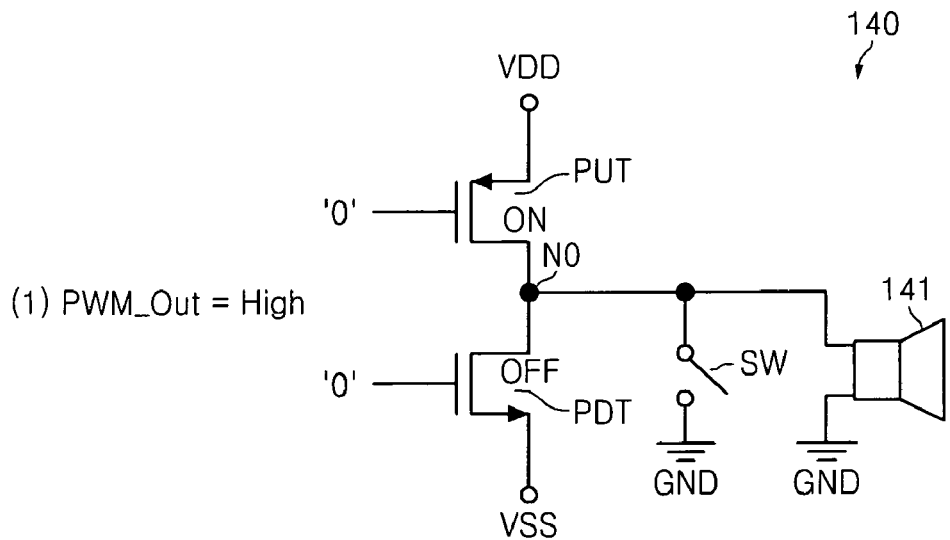
FIGS. 9A-9C are circuit diagrams showing the operations of the output stage illustrated in FIG. 6 according to different levels of a PWM output signal, according to an exemplary embodiment of the present inventive concept.
Figure 9B:
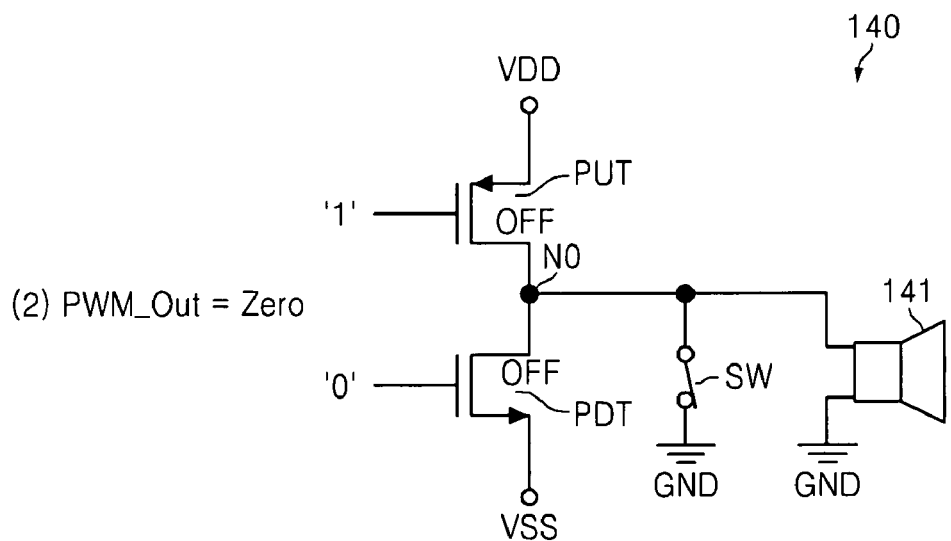
Figure 9C:
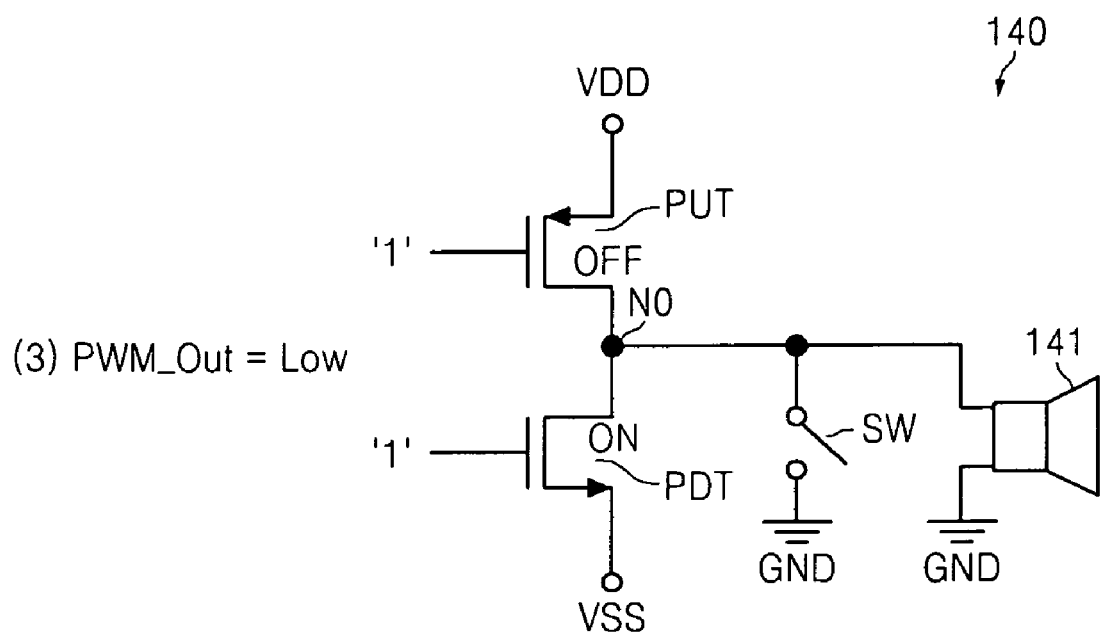
Figures 10, 11:
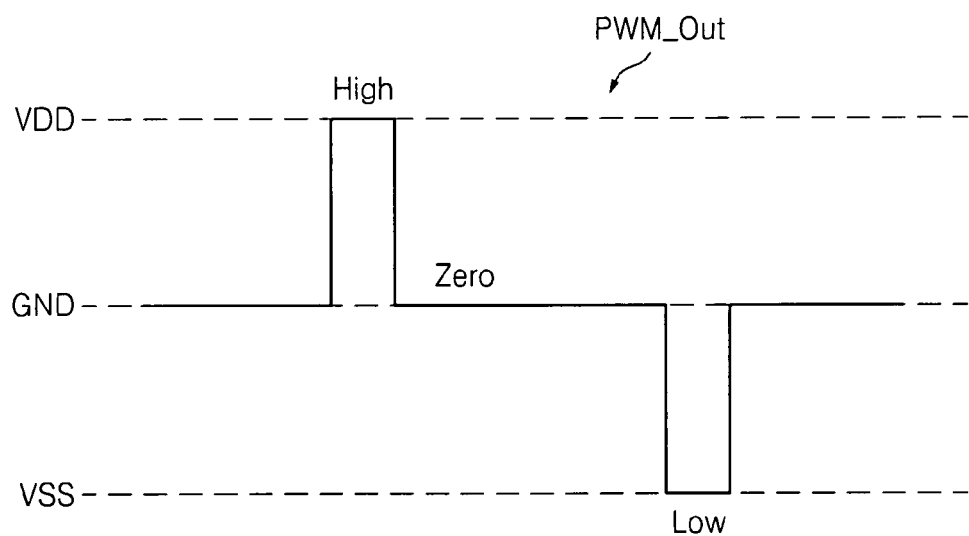
FIG. 10 is a table representing a mapper illustrated in FIG. 3, according to an exemplary embodiment of the present inventive concept.
FIG. 11 is a diagram of a signal representing the different levels of the PWM output signal, according to an exemplary embodiment of the present inventive concept.

FIGS. 9A-9C are circuit diagrams illustrating the operations of the output stage 140 illustrated in FIG. 6 according to different levels of the PWM output signal PWM_Out, according to an exemplary embodiment of the present inventive concept. FIG. 10 is a table representing the mapper 130 illustrated in FIG. 3, according to an exemplary embodiment of the present inventive concept. FIG. 11 is a diagram of a signal representing different levels of the PWM output signal PWM_Out, according to an exemplary embodiment of the present inventive concept.

Referring to FIGS. 9A-9C, 10 and 11, an output signal of a PWM generator according to an exemplary embodiment of the present inventive concept, namely, the PWM output signal PWM_Out has three levels, for example, a high level of VDD, a zero level of GND, and a low level of VSS, as illustrated in FIG. 11. Accordingly, the output stage 140 operates in three modes according to the levels of the PWM output signal PWM_Out, as illustrated in FIGS. 9A-9C. For the operations of the output stage 140 illustrated in FIGS. 9A-9C, the mapper 130 selectively activates the enable signals VDD_EN, VSS_EN, and GND_EN according to the PWM output signal PWM_Out, as illustrated in FIG. 10.

As illustrated in FIG. 9A, when the PWM output signal PWM_Out is at the high level of VDD, only the first enable signal VDD_EN is activated to "0" and the other enable signals VSS_EN and GND_EN are deactivated to "0", so that the output stage 140 drives the output node NO to the first power supply voltage VDD. As illustrated in FIG. 9C, when the PWM output signal PWM_Out is at the low level of VSS, only the second enable signal VSS_EN is activated to "1" and the other enable signals VDD_EN and GND_EN are deactivated to "1" and "0," respectively, so that the output stage 140 drives the output node NO to the second power supply voltage VSS. As illustrated in FIG. 9B, when the PWM output signal PWM_Out is at the zero level of GND, only the third enable signal GND_EN is activated to "1" and the other enable signals VDD_EN and VSS_EN are deactivated to "1" and "0," respectively, so that the output stage 140 drives the output node NO to the third power supply voltage GND.

Figure 12:
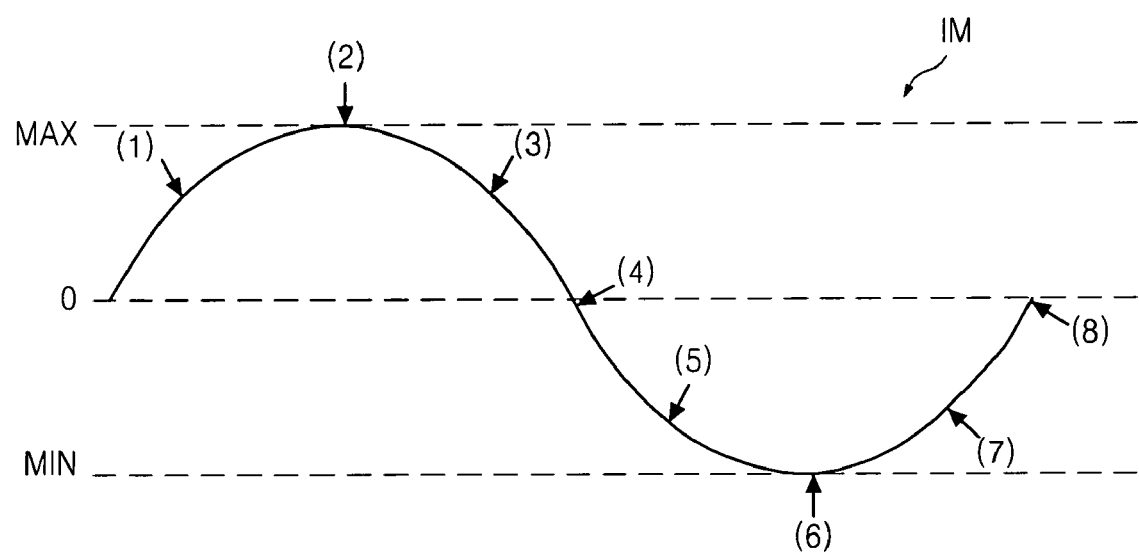
FIG. 12 is a waveform diagram of an amplifier input signal, according to another exemplary embodiment of the present inventive concept.

FIG. 12 is a waveform diagram of an amplifier input signal IM, according to another exemplary embodiment of the present inventive concept. FIGS. 13A-13H are waveform diagrams of a three-level PWM output signal PWM_Out with respect to the amplifier input signal IM illustrated in FIG. 12, according to an exemplary embodiment of the present inventive concept. As illustrated in FIG. 12, the amplifier input signal IM swings between a positive peak voltage MAX and a negative peak voltage MIN. With respect to each of eight different stages (1) through (8) of the amplifier input signal IM illustrated in FIG. 12, the PWM output signal PWM_Out switches to one of three levels VDD, GND, and VSS, as illustrated in FIGS. 13A-13H.

Figure 13A:
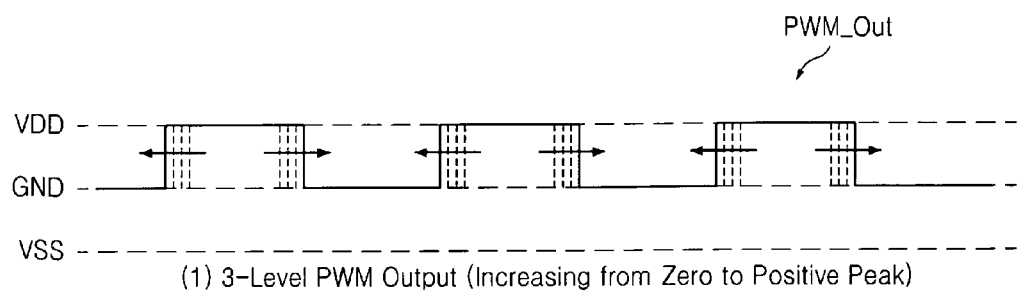
FIGS. 13A-13H are waveform diagrams of a three-level PWM output signal with respect to the amplifier input signal illustrated in FIG. 12, according to an exemplary embodiment of the present inventive concept.

With respect to stage (1) at which the input signal IM increases from zero voltage toward the positive peak voltage MAX in FIG. 12, the PWM output signal PWM_Out has an increasing width of a pulse at the level VDD as illustrated in waveform (1) of FIG. 13A. At this time, a minimum pulse having the level VSS may be output at each cycle of the PWM output signal PWM_Out. Apart from the pulses having increasing widths at the level VDD, the PWM output signal PWM_Out is output at the ground level GND, thereby preventing unnecessary static current from occurring.

Figure 13B:
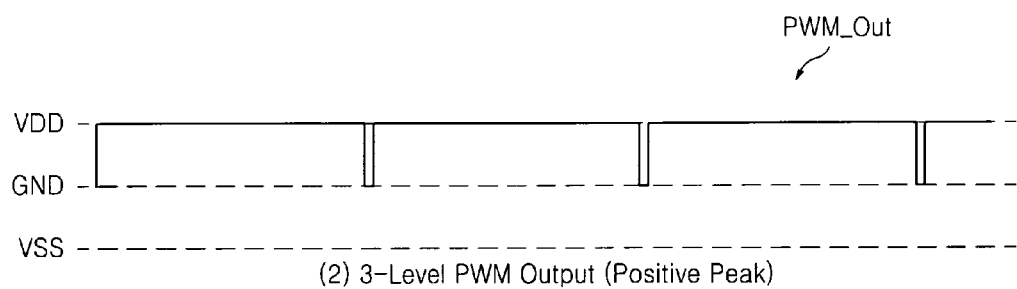
Figure 13C:
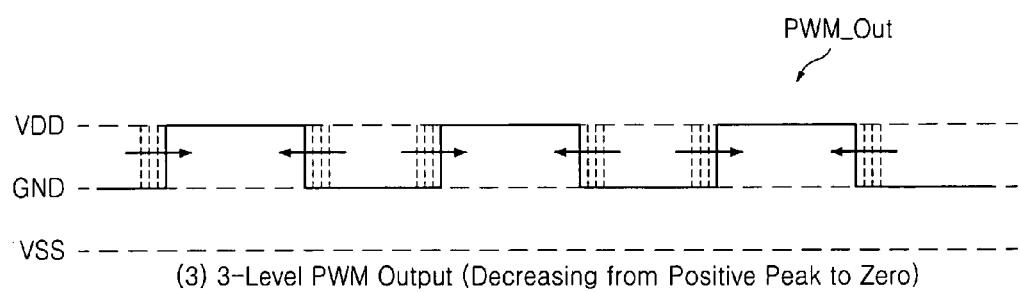
Figure 13D:
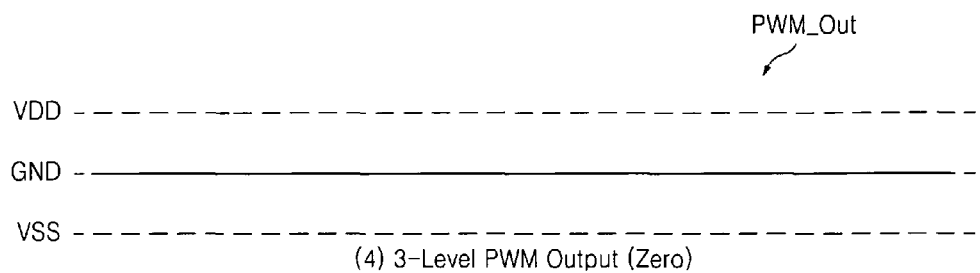

When the input signal IM reaches the positive peak voltage MAX at stage (2) in FIG. 12, the PWM output signal PWM_Out has a maximum width of a pulse at the level VDD as illustrated in waveform (2) of FIG. 13B. When the input signal IM decreases from the positive peak voltage MAX toward zero voltage at stage (3) in FIG. 12, the PWM output signal PWM_Out has a decreasing width of the pulse at the level VDD as illustrated in waveform (3) of FIG. 13C. When the input signal IM is "0" at stage (4) in FIG. 12, the PWM output signal PWM_Out is output at the ground level GND for most of time as illustrated in waveform (4) of FIG. 13D.

As illustrated in FIGS. 1 and 2, when the input signal is zero, the typical two-level PWM output signal switches to the level VDD and the level VSS with a duty ratio of 50:50 and does not have the ground level GND. As a result, static current is consumed to the maximum. In contrast, when a three-level PWM amplifier according to the exemplary embodiments of the present inventive concept is used, there is hardly any static current consumption with respect to an input of zero voltage.

Figure 13E:
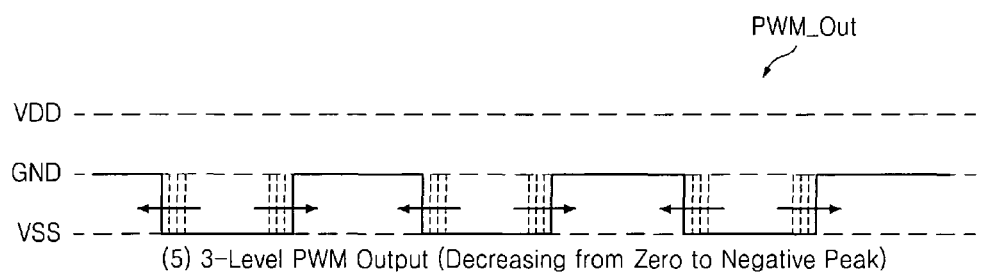

With respect to stage (5) at which the input signal IM decreases from zero voltage toward the negative peak voltage MIN in FIG. 12, the PWM output signal PWM_Out has an increasing width of a pulse at the level VSS as illustrated in waveform (5) of FIG. 13E. At this time, apart from the pulses having increasing widths at the level VSS, the PWM output signal PWM_Out is output at the ground level GND, thereby preventing unnecessary static current from occurring.

Figure 13F:
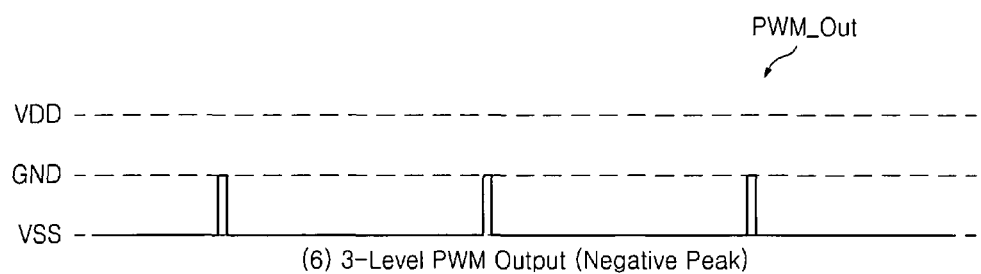
Figure 13G:
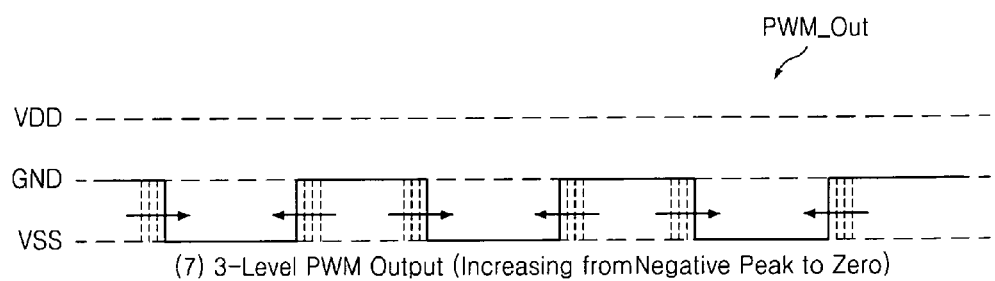
Figure 13H:
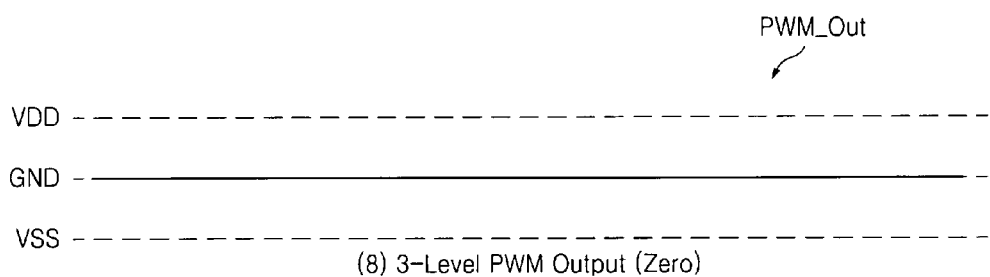

When the input signal IM reaches the negative peak voltage MIN at stage (6) in FIG. 12, the PWM output signal PWM_Out has a maximum width of the pulse at the level VSS as illustrated in waveform (6) of FIG. 13F. When the input signal IM increases from the negative peak voltage MIN toward zero voltage at stage (7) in FIG. 12, the PWM output signal PWM_Out has a decreasing width of the pulse at the level VSS as illustrated in waveform (7) of FIG. 13G. When the input signal IM is "0" at stage (8) in FIG. 12, the PWM output signal PWM_Out is output at the ground level GND for most of time as illustrated in waveform (8) of FIG. 13H.

As described above, according to the exemplary embodiments of the present inventive concept, a three-level PWM amplifier outputs a PWM output signal at the ground level during a period unnecessary for the output of signal components, thereby remarkably suppressing static current. When a typical two-level PWM amplifier is used, pop-up noise may occur due to DC offset caused by mismatch between the voltage VDD and the voltage VSS. When a three-level PWM amplifier according to the exemplary embodiments of the present inventive concept is used, DC offset occurring due to voltage mismatch is mostly suppressed since a PWM output signal is at the ground level for most of the time in which an input signal is zero.

Accordingly, a three-level half-bridge PWM amplifier according to the exemplary embodiments of the present inventive concept increases efficiency by reducing static current, thereby reducing power consumption of a system and increasing operating time. Accordingly, the present inventive concept provides convenience and reliability for system design.

Exemplary embodiment of the present inventive concept can be embodied in hardware, software, firmware or a combination thereof.

The present inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable transmission medium can transmit carrier waves or signals, for example, wired or wireless data transmission through the Internet. The computer-readable recording medium can also be distributed over network coupled computer systems so that the computer-readable code is stored and executed in a distributed fashion. Also, functional programs, codes, and code segments to accomplish the present inventive concept can be easily construed by those of ordinary skill in the art to which the present inventive concept pertains.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A three-level half-bridge pulse-width modulation (PWM) amplifier comprising:
    a PWM generator configured to change a width of a pulse at a first voltage level or a second voltage level according to an amplitude of an input signal and output a three-level PWM output signal having the first voltage level, the second voltage level, and a reference voltage level, wherein the PWM generator outputs the three-level PWM output signal having the reference voltage level when the input signal is zero; and
    an output stage configured to drive an output node connected to a terminal of a load to one voltage among a first power supply voltage, a second power supply voltage, and a third power supply voltage based on the three-level PWM output signal.

2. The three-level half-bridge PWM amplifier of claim 1, wherein the PWM generator outputs the three-level PWM output signal by summing a first PWM signal obtained by changing the width of the pulse at the first voltage level according to an amplitude of a first input signal of the input signal greater than the reference voltage level of the input signal and a second PWM signal obtained by changing the width of the pulse at the second voltage level according to an amplitude of a second input signal of the input signal smaller than the reference voltage level of the input signal.

3. The three-level half-bridge PWM amplifier of claim 2, wherein the reference voltage level is a ground level, the first input signal is a positive input signal, and the second input signal is a negative input signal.

4. The three-level half-bridge PWM amplifier of claim 3, wherein the PWM generator comprises:
    a first comparator configured to compare the positive input signal with a first sawtooth wave signal swinging between the first voltage level and the reference voltage level and to generate the first PWM signal; and
    a second comparator configured to compare the negative input signal with a second sawtooth wave signal swinging between the reference voltage level and the second voltage level and to generate the second PWM signal,
    wherein the second sawtooth wave signal is a signal level-downed by a swing width of the first sawtooth wave signal and has the same waveform as the first sawtooth wave signal.

5. The three-level half-bridge PWM amplifier of claim 4, wherein the third power supply voltage has the ground level, the first power supply voltage is a positive voltage higher than the third power supply voltage, and the second power supply voltage is a negative voltage lower than the third power supply voltage.

6. The three-level half-bridge PWM amplifier of claim 1, wherein the output stage comprises:
    a pull-up unit configured to drive the output node to the first power supply voltage in response to a first enable signal;
    a pull-down unit configured to drive the output node to the second power supply voltage in response to a second enable signal; and
    a switching unit configured to drive the output node to the third power supply voltage in response to a third enable signal.

7. The three-level half-bridge PWM amplifier of claim 6, wherein the pull-up unit comprises a pull-up transistor connected between the output node and the first power supply voltage and turned on in response to the first enable signal;
    the pull-down unit comprises a pull-down transistor connected between the output node and the second power supply voltage and turned on in response to the second enable signal; and
    the switching unit comprises at least one switch connected between the output node and the third power supply voltage and turned on in response to the third enable signal.

8. The three-level half-bridge PWM amplifier of claim 1, wherein the input signal is a delta-sigma modulated signal.

9. The three-level half-bridge PWM amplifier of claim 1, wherein another terminal of the load is connected to a ground.

10. An audio system comprising a three-level half-bridge PWM amplifier, wherein the three-level half-bridge PWM amplifier comprises:
    a PWM generator configured to change a width of a pulse at a first voltage level or a second voltage level according to an amplitude of an input signal and output a three-level PWM output signal having the first voltage level, the second voltage level, and a reference voltage level, wherein the PWM generator outputs the three-level PWM output signal having the reference voltage level when the input signal is zero; and
    a output stage configured to drive an output node connected to a terminal of a load to one voltage among a first power supply voltage, a second power supply voltage, and a third power supply voltage based on the three-level PWM output signal.

11. The audio system of claim 10, wherein the PWM generator outputs the three-level PWM output signal by summing a first PWM signal obtained by changing the width of the pulse at the first voltage level according to an amplitude of a first input signal of the input signal greater than the reference voltage level of the input signal and a second PWM signal obtained by changing the width of the pulse at the second voltage level according to an amplitude of a second input signal of the input signal smaller than the reference voltage level of the input signal.

12. The audio system of claim 11, wherein the reference voltage level is a ground level, the first input signal is a positive input signal, and the second input signal is a negative input signal.

13. The audio system of claim 12, wherein the PWM generator comprises:
  a first comparator configured to compare the positive input signal with a first sawtooth wave signal swinging between the first voltage level and the reference voltage level and to generate the first PWM signal; and
  a second comparator configured to compare the negative input signal with a second sawtooth wave signal swinging between the reference voltage level and the second voltage level and to generate the second PWM signal,
  wherein the second sawtooth wave signal is a signal level-downed by a swing width of the first sawtooth wave signal and has the same waveform as the first sawtooth wave signal.

14. The audio system of claim 13, wherein the third power supply voltage has the ground level, the first power supply voltage is a positive voltage higher than the third power supply voltage, and the second power supply voltage is a negative voltage lower than the third power supply voltage.

15. The audio system of claim 10, wherein the output stage comprises:
  a pull-up unit configured to drive the output node to the first power supply voltage in response to a first enable signal;
  a pull-down unit configured to drive the output node to the second power supply voltage in response to a second enable signal; and
  a switching unit configured to drive the output node to the third power supply voltage in response to a third enable signal.

16. The audio system of claim 15, wherein the pull-up unit comprises a pull-up transistor connected between the output node and the first power supply voltage and turned on in response to the first enable signal;
  the pull-down unit comprises a pull-down transistor connected between the output node and the second power supply voltage and turned on in response to the second enable signal; and
  the switching unit comprises at least one switch connected between the output node and the third power supply voltage and turned on in response to the third enable signal.

17. A method of driving a three-level half-bridge pulse-width modulation (PWM) amplifier, the method comprising:
  generating a three-level PWM output signal having a first voltage level, a second voltage level, and a reference voltage level and having a width of a pulse changing at the first voltage level or the second voltage level according to an amplitude of an input signal, wherein the three-level PWM output signal is generated having the reference voltage level when the input signal is zero; and
  driving an output node connected to a terminal of a load to one voltage among a first power supply voltage, a second power supply voltage, and a third power supply voltage based on the three-level PWM output signal.

18. The method of claim 17, wherein the generating the three-level PWM output signal comprises:
  generating a first PWM signal by changing the width of the pulse at the first voltage level according to an amplitude of a first input signal of the input signal greater than the reference voltage level of the input signal;
  generating a second PWM signal by changing the width of the pulse at the second voltage level according to an amplitude of a second input signal of the input signal smaller than the reference voltage level of the input signal; and
  outputting the three-level PWM output signal by summing the first PWM signal and the second PWM signal.

19. The method of claim 18, wherein the reference voltage level is a ground level, the first input signal is a positive input signal, and the second input signal is a negative input signal,
  wherein the generating the first PWM signal comprises comparing the positive input signal with a first sawtooth wave signal swinging between the first voltage level and the reference voltage level,
  wherein the generating the second PWM signal comprises comparing the negative input signal with a second sawtooth wave signal swinging between the reference voltage level and the second voltage level, and
  wherein the second sawtooth wave signal is a signal level-downed by a swing width of the first sawtooth wave signal and has the same waveform as the first sawtooth wave signal.

20. The method of claim 18, wherein, while the first input signal is being input, the width of the pulse at the first voltage level is changed according to the amplitude of the first input signal and the pulse at the second voltage level has a predetermined minimum width; and
  while the second input signal is being input, the width of the pulse at the second voltage level is changed according to the amplitude of the second input signal and the pulse at the first voltage level has the predetermined minimum width.

* * * * *